(12) United States Patent
Harvey et al.

(10) Patent No.: US 8,222,739 B2
(45) Date of Patent: Jul. 17, 2012

(54) SYSTEM TO IMPROVE CORELESS PACKAGE CONNECTIONS

(75) Inventors: Paul M. Harvey, Austin, TX (US);
Colm B. O'Reilly, Austin, TX (US);
Samuel W. Yang, Austin, TX (US);
Yaping Zhou, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 170 days.

(21) Appl. No.: 12/642,806

(22) Filed: Dec. 19, 2009

(65) Prior Publication Data
US 2011/0147044 A1      Jun. 23, 2011

(51) Int. Cl.
*H01L 23/48* (2006.01)
*H01L 21/00* (2006.01)
*B23K 31/02* (2006.01)

(52) U.S. Cl. ........ 257/738; 257/779; 257/780; 438/108; 228/180.22

(58) Field of Classification Search .......................... None
See application file for complete search history.

(56) References Cited

U.S. PATENT DOCUMENTS

| | | | |
|---|---|---|---|
| 4,676,623 A | 6/1987 | Akashi et al. ................... 396/92 |
| 5,038,147 A | 8/1991 | Cerro et al. ................... 342/368 |
| 5,457,557 A | 10/1995 | Zarem et al. ................... 398/116 |
| 5,816,482 A | 10/1998 | Grabbe ........................ 228/212 |
| 6,323,804 B1 | 11/2001 | Kurby et al. ............. 342/357.64 |
| 6,581,278 B2 | 6/2003 | Kay .................................. 29/830 |
| 6,670,430 B1 * | 12/2003 | Konarski ...................... 525/523 |
| 6,828,556 B2 | 12/2004 | Pobanz et al. ............ 250/336.1 |
| 7,307,341 B2 | 12/2007 | Humbert et al. .............. 257/728 |
| 7,570,221 B2 | 8/2009 | May et al. ..................... 343/753 |
| 2004/0212358 A1 | 10/2004 | Stephen et al. ............ 324/76.19 |
| 2005/0067576 A1 | 3/2005 | Caria ........................ 250/370.08 |
| 2006/0279458 A1 | 12/2006 | Mohamadi .................... 342/368 |
| 2007/0178627 A1 * | 8/2007 | Jiang et al. ................... 438/108 |
| 2008/0079652 A1 | 4/2008 | Mohamadi .................... 343/893 |
| 2009/0284405 A1 | 11/2009 | Salmon et al. ................. 342/22 |
| 2010/0148368 A1 * | 6/2010 | Nishizawa .................... 257/762 |
| 2010/0276796 A1 * | 11/2010 | Andry et al. ................. 257/692 |
| 2011/0171756 A1 * | 7/2011 | Andry et al. ..................... 438/4 |

* cited by examiner

*Primary Examiner* — Alonzo Chambliss

(74) *Attorney, Agent, or Firm* — Ido Tuchman; Matthew Talpis

(57) ABSTRACT

A system to improve core package connections may include ball grid array pads, and a ball grid array. The system may also include connection members of the ball grid array conductively connected to respective ball grid array pads. The system may further include magnetic underfill positioned adjacent at least some of the connection members and respective ball grid array pads to increase respective connection members' inductance.

17 Claims, 15 Drawing Sheets

Conventional via structure controlling via impedance

SYSTEM TO IMPROVE CORELESS PACKAGE CONNECTIONS

BACKGROUND

A ball grid array ("BGA") may be a surface mount package carrying an integrated circuit and connections members. The connections members are usually coupled to ball grid array pads carried by a printed circuit board.

A coreless package is a type of integrated circuit package that may have no rigid epoxy core. The coreless package usually includes an alternating layered substrate having insulating layers separated by patterned conductor layers.

SUMMARY

According to one embodiment, a system to improve core package connections may include ball grid array pads, and a ball grid array. The system may also include connection members of the ball grid array conductively connected to respective ball grid array pads. The system may further include magnetic underfill positioned adjacent at least some of the connection members and respective ball grid array pads to increase respective connection members' inductance.

The magnetic underfill may include resin mixed with magnetic materials. The resin may include epoxy and the magnetic material may include ferrite powder and/or ferromagnetic materials. The mixture may be selected based upon a desired permeability.

The magnetic underfill may be applied based upon the ball grid array's height after collapse. The resin may have a glass temperature higher than the ball grid array's reflow temperature so flow of the resin can be controlled during reflow.

The system may include resin and/or resin mixed with dielectric constant materials positioned where the magnetic underfill is undesirable. The ball grid array may be carried by a coreless package.

Another aspect is a method to improve core package connections. The method may include positioning magnetic underfill adjacent at least some of connection members of a ball grid array and respective ball grid array pads to increase the connection members' inductance. The method may also include conductively connecting the connection members of the ball grid array to respective ball grid array pads.

The method may further include applying the magnetic underfill based upon the ball grid array's height after collapse. The method may additionally include mixing resin with magnetic materials based upon a desired permeability to produce the magnetic underfill.

The method may also include selecting at least one of ferrite powder and ferromagnetic materials for the magnetic material. The method may further include controlling the flow of the resin during reflow by selecting for the resin a glass temperature higher than the ball grid array's reflow temperature.

The method may also include positioning at least one of a resin and resin mixed with dielectric constant materials where the magnetic underfill is undesirable. The method may further include curing the magnetic underfill using at least one of thermal curing, infrared curing, and ultraviolet curing. The method may additionally include cleaning any residue from the ball grid array' exposed surface after the conductive connection.

In one embodiment, the system may include ball grid array pads, a coreless package, and a ball grid array carried by the coreless package. The system may also include connection members of the ball grid array conductively connected to respective ball grid array pads. The system may further include magnetic underfill positioned adjacent at least some of the connection members and respective ball grid array pads to increase respective connection members' inductance, and the magnetic underfill is applied based upon the ball grid array's height after collapse.

In another embodiment, the system may include ball grid array pads, a coreless package, and a ball grid array carried by the coreless package. The system may also include connection members of the ball grid array conductively connected to respective ball grid array pads. The system may further include magnetic underfill positioned adjacent at least some of the connection members and respective ball grid array pads to increase respective connection members' inductance. The system may additionally include resin and/or resin mixed with dielectric constant materials positioned where the magnetic underfill is undesirable.

DETAILED DESCRIPTION

The embodiments will now be described more fully hereinafter with reference to the accompanying drawings. Like numbers refer to like elements throughout, like numbers with letter suffixes are used to identify similar parts in a single embodiment, letter suffix lower case n indicates any unused letter, and prime notations are used to indicate similar elements in alternative embodiments.

It should be noted that in some alternative implementations, the functions noted in a flowchart block may occur out of the order noted in the figures. For example, two blocks shown in succession may, in fact, be executed substantially concurrently, or the blocks may sometimes be executed in the reverse order, depending upon the functionality involved.

Figure 1:
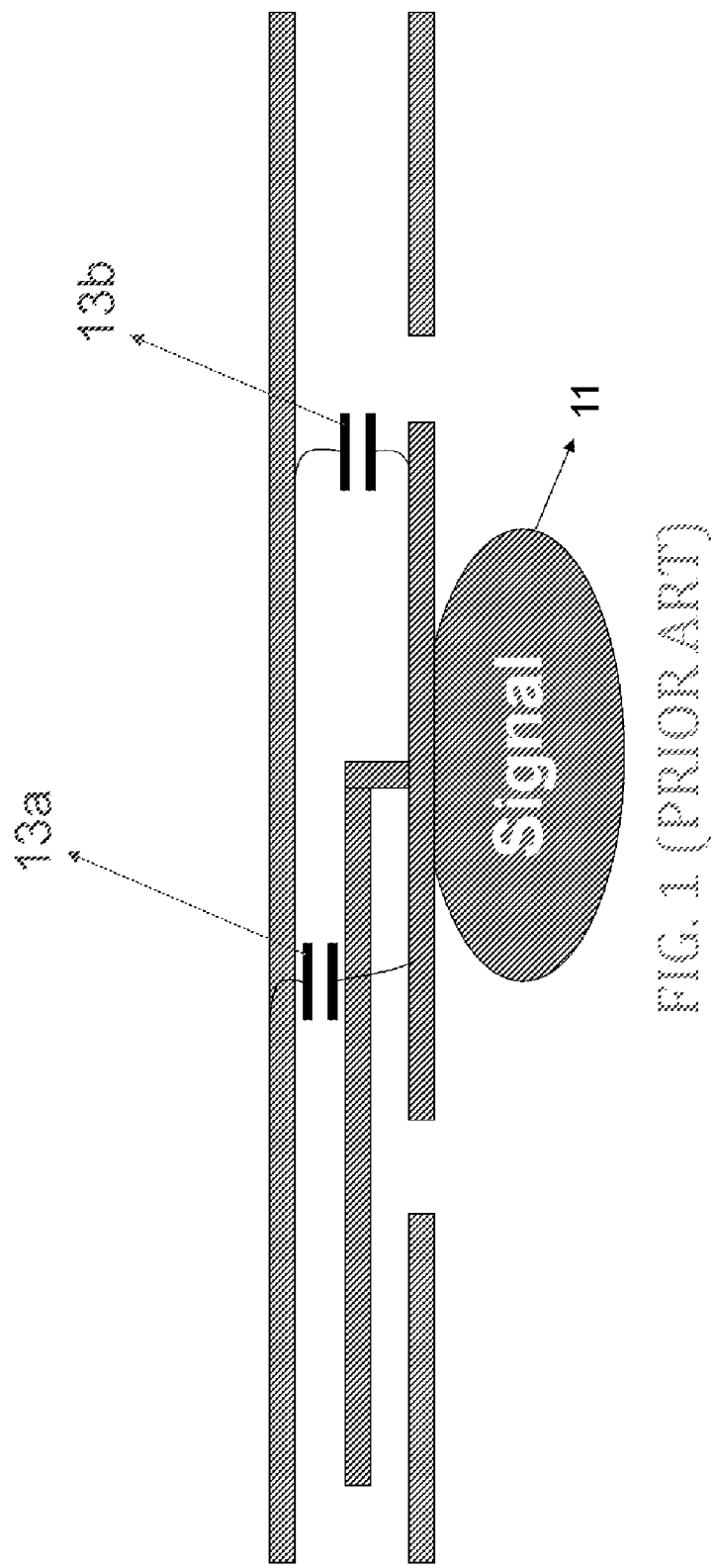
FIG. 1 is a schematic block diagram of a prior art BGA pad connected to a chip package.
Figure 2:
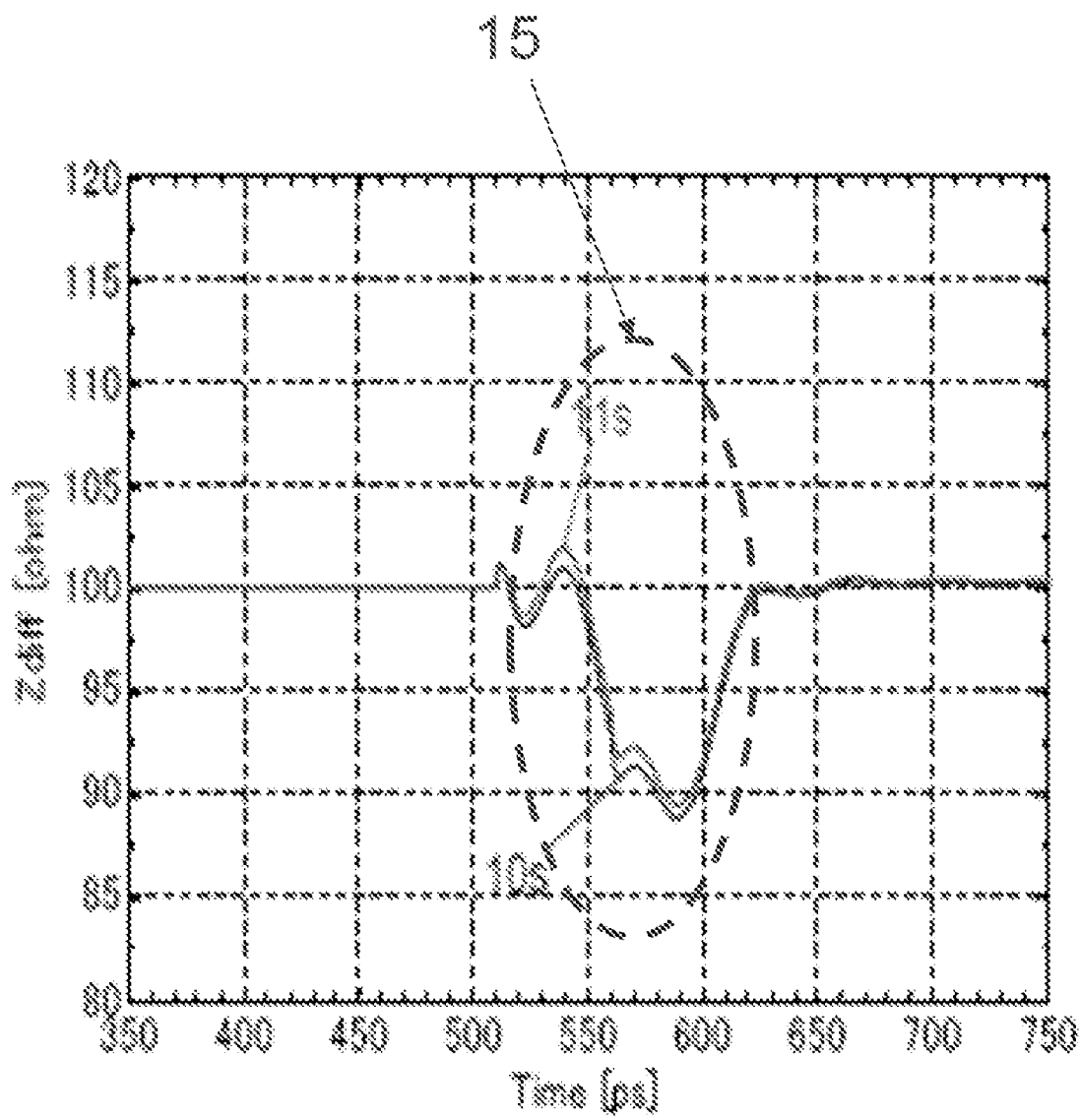
FIG. 2 is a prior art time domain reflectometer graph.

With reference now to FIGS. 1 and 2, in the prior art, extra capacitance 13a-13b may be associated with a BGA pad 11 that may introduce impedance discontinuity 15 that cause detrimental signal effects. The impedance discontinuity 15 is illustrated by a time domain reflectometer graph of the detrimental signal effects.

Figure 3:
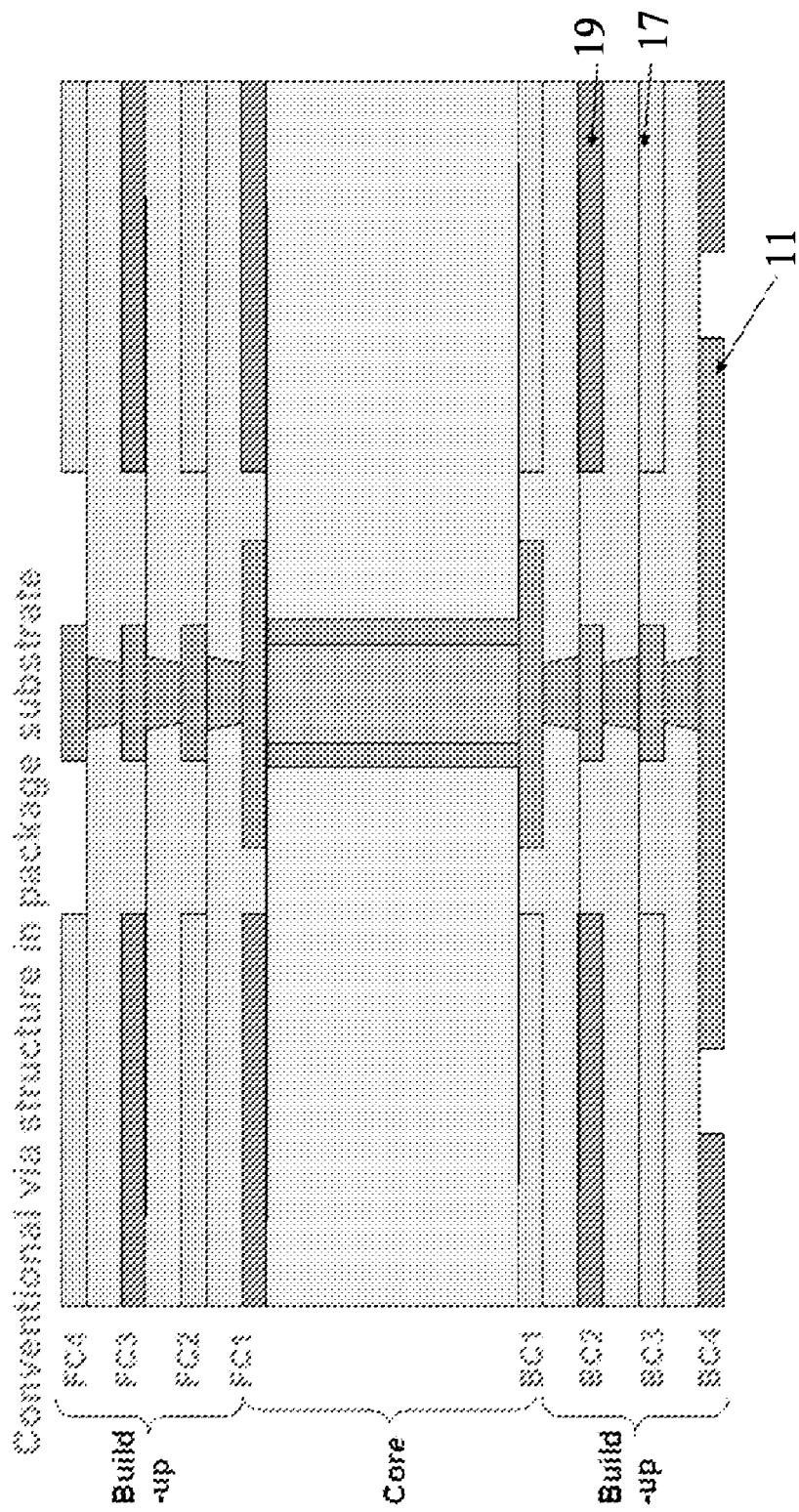
FIG. 3 is a prior art package substrate.

With additional reference to FIG. 3, a prior art package is illustrated in which a portion of the BGA pad 11 are overlapped by power supply 17 and/or ground 19. As a result, there can be significant impedance discontinuity in the prior art package and this problem becomes greater as the signal speed increases.

Figure 4:
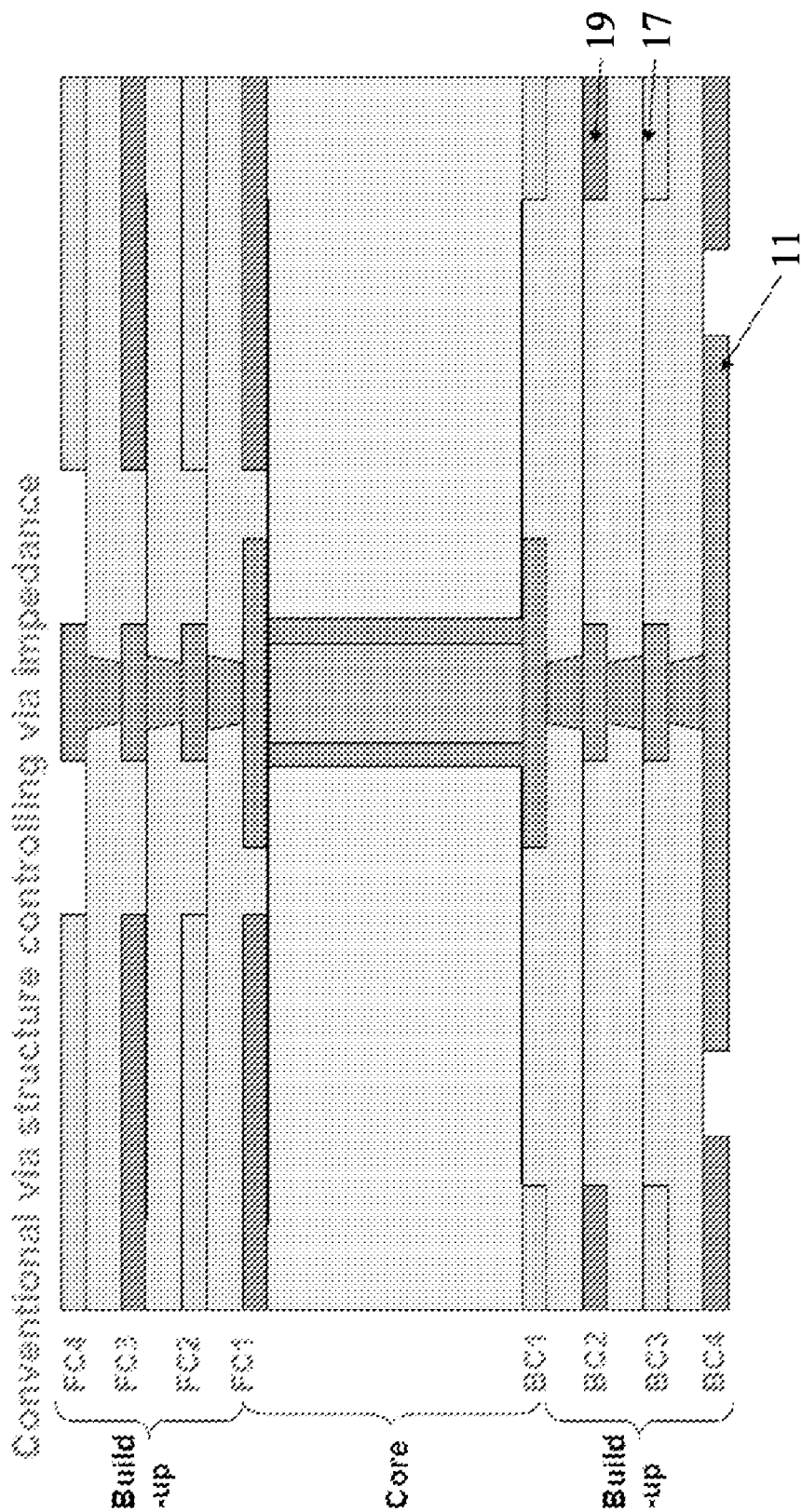
FIG. 4 is another embodiment of a prior art package substrate.

One prior art solution to the preceding, which is illustrated in FIG. 4, is to remove the overlap between the BGA pad 11 and the power supply 17 and/or the ground 19. However, removing the overlap may weaken the mechanical strength of the package and it may impact routing capabilities and power integrity of the package. Additionally, the foregoing design will not work with coreless packages because of the coreless package's lack of a thick core that can reduce the BGA pad capacitance.

A coreless substrate for use in a semiconductor package may contain no core made of relatively rigid glass epoxy. The coreless substrate may include a build-up substrate, e.g. surface laminar circuit substrate composed of alternatively stacked insulating layers and patterned conductor layers. A package obtained by mounting a semiconductor chip on the coreless substrate is generally called a coreless chip package.

A conventional coreless package may have a mounted semiconductor chip that electrically connects with an electrode pad on the surface of the substrate. The space between the surface of the substrate and the semiconductor chip is usually filled with an underfill made of a resin material. A stiffener made of a resin material may be arranged around the semiconductor chip on the substrate. The coreless substrate, having no rigid core, is lower in stiffness than a substrate with a core. The resin stiffener is provided for the purpose of compensating for such low stiffness of the substrate. A ball grid array (BGA) may be used for electrically connecting the substrate to another substrate. In any configuration a BGA and its respective BGA pads have to be within joining distance of each other.

To address the problems described above, a system 10 to improve cored and coreless package connections is initially described that will improve signal integrity of high-speed signals by minimizing the impedance discontinuity from the BGA and BGA pads and/or the like.

Figure 5:
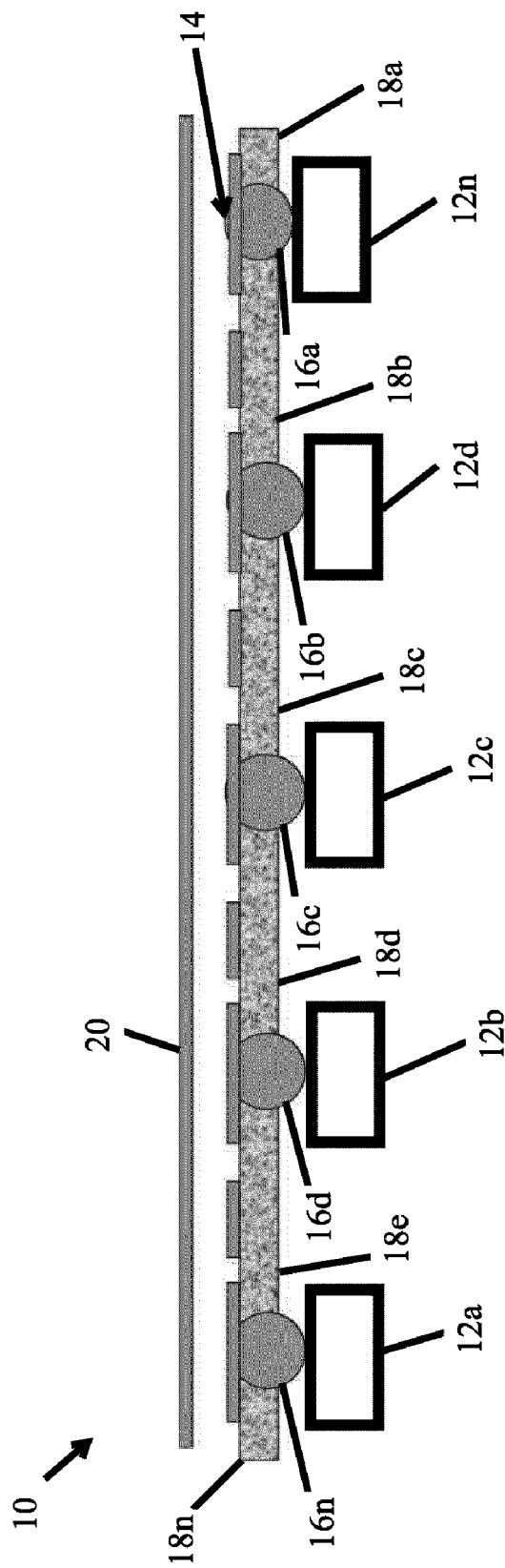
FIG. 5 is a schematic block diagram of a system to improve core package connections.
Figure 6:
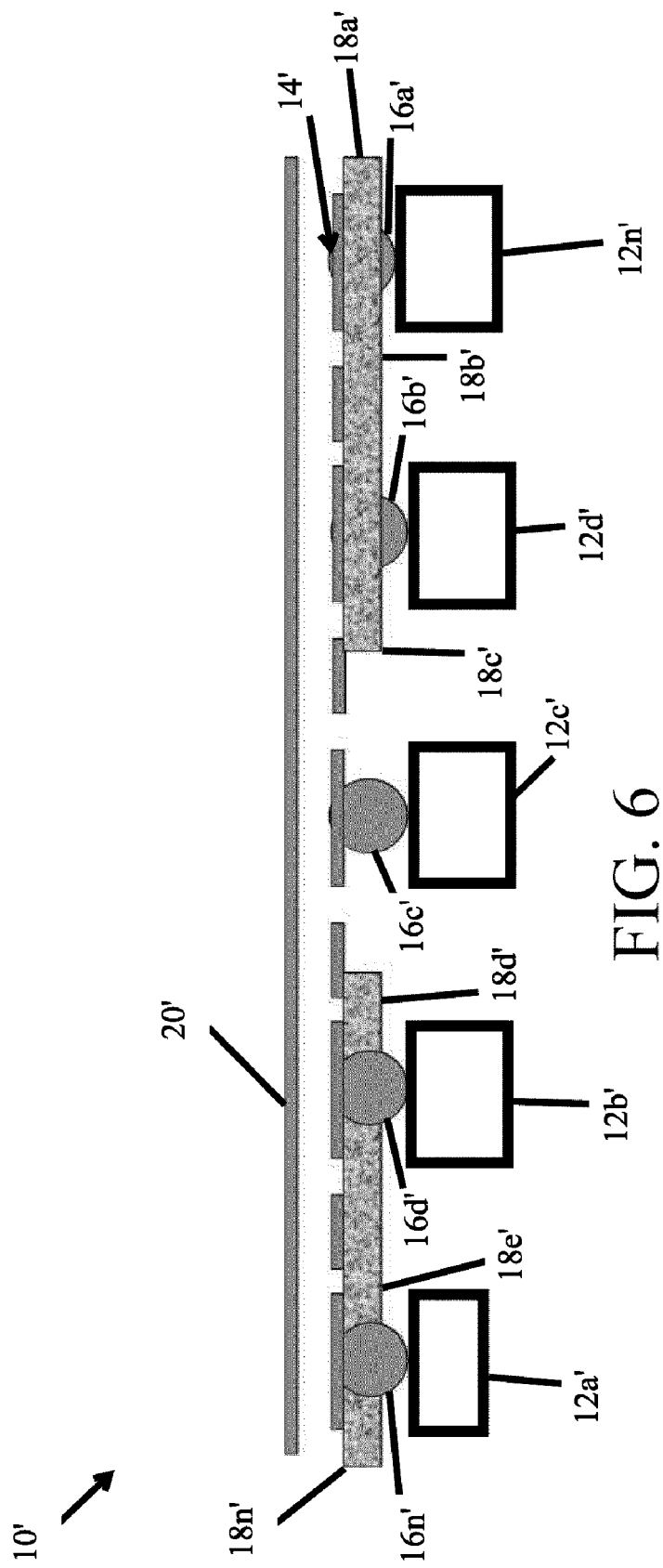
FIG. 6 is a schematic block diagram of another embodiment of the system of FIG. 5.
Figure 7:
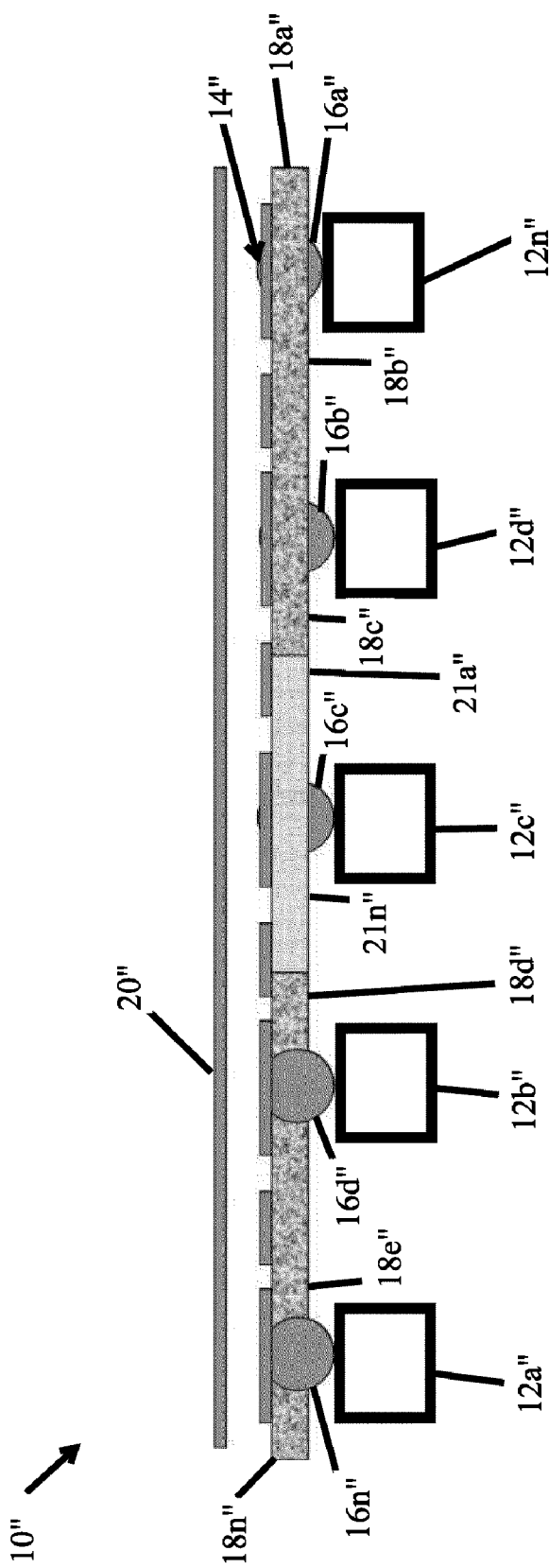
FIG. 7 is a schematic block diagram of another embodiment of the system of FIG. 5.

The following items are referred to in FIGS. 5-7:

10, 10', 10"-system
12a-12n, 12a'-12n', 12a"-12n"-ball grid array pads
14-ball grid array
16a-16n, 16a'-16n', 16a"-16n"-connection members
18a-18n, 18a'-18n', 18a"-18n"-magnetic underfill
20, 20', 20"-coreless package
21a-21n, 21a'-21n', 21a"-21n"-dielectric constant materials.

With additional reference to FIGS. 5 and 6, according to one embodiment, the system 10 includes ball grid array pads 12a-12n, and a ball grid array 14. In one embodiment, the system 10 includes connection members 16a-16n of the ball grid array 14 conductively connected to respective ball grid array pads 12a-12n. In another embodiment, the system 10 includes magnetic underfill 18a-18n positioned adjacent at least some of the connection members 16a-16n and respective ball grid array pads 12a-12n to increase respective connection members' inductance.

In one embodiment, the magnetic underfill 18a-18n includes resin mixed with magnetic materials. In another embodiment, the resin includes epoxy, and the magnetic material includes ferrite powder and/or ferromagnetic materials. In one embodiment, the mixture is selected based upon a desired permeability for the magnetic underfill 18a-18n. In one embodiment, system 10 adds inductance to balance capacitance so that impedance discontinuity will be reduced. For example, inductance is proportional to the permeability of its environment and system 10 controls the permeability of the underfill to achieve the optimal performance.

In another embodiment, the magnetic underfill 18a-18n is applied based upon the ball grid array's 14 height after collapse. For instance, collapse means the connection medium, e.g. solder, is melted to form the BGA connections with the BGA pads. In addition, by the selection of an appropriate connection medium and by managing the application of heat, the collapse of the BGA can be controlled.

In one embodiment, the resin has a glass temperature, e.g. melting point, higher than the ball grid array's 14 reflow temperature so flow of the resin can be controlled during reflow. For example, "reflow" usually means melting the resin to form connections while minimally impacting the BGA connection medium connections. In one embodiment, the reflow temperature matters and system 10 controls the location of the magnetic underfill when the resins are melted.

With additional reference to FIG. 7, in another embodiment, the system 10" includes resin and/or resin mixed with dielectric constant materials 21a"-21n" positioned where the magnetic underfill 18a"-18n" is undesirable such as in the power supply area to provide increased capacitance for the power supply. In one embodiment, the ball grid array 14" is carried by a coreless package 20".

Figure 8:
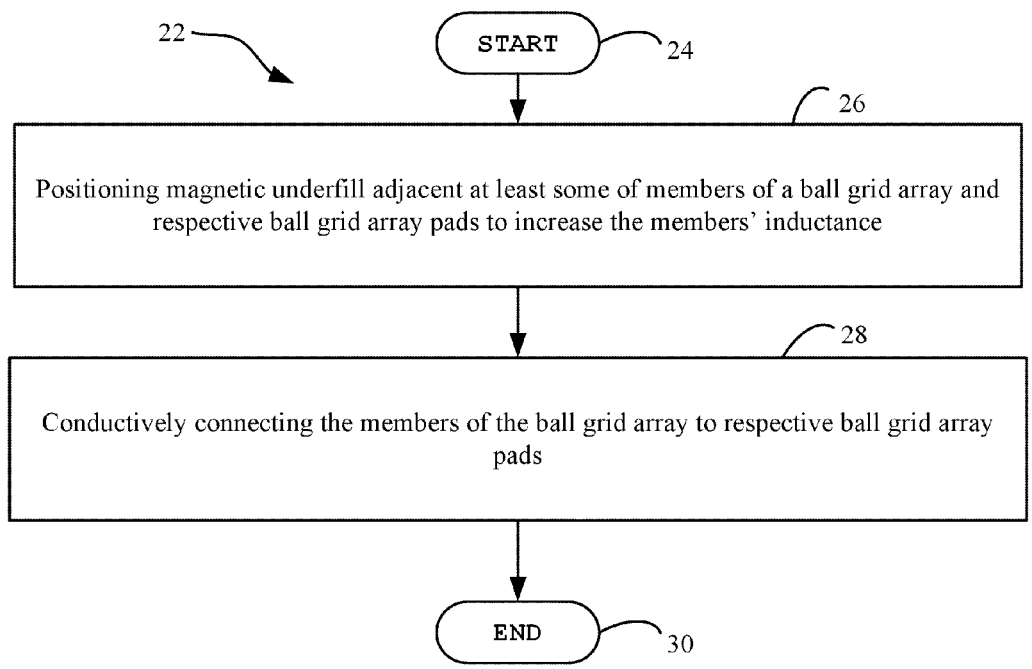
FIG. 8 is a flowchart illustrating method aspects according to embodiments of the invention.

Another embodiment is a method to improve core package connections, which is now described with reference to flowchart 22 of FIG. 8. The method begins at Block 24 and may include positioning magnetic underfill adjacent at least some of connection members of a ball grid array and respective ball grid array pads to increase the connection members' inductance at Block 26. The method may also include conductively connecting the connection members of the ball grid array to respective ball grid array pads at Block 28. The method ends at Block 30.

In one embodiment, high speed signals may be adversely affected by the extra capacitance from the BGA pads, so system 10 will have magnetic underfill in areas with high speed signals (e.g., signals in the gigahertz frequency range). In another embodiment, adding extra inductance may not be desirable to some signals or power BGAs, but system 10 will have magnetic underfill for all areas if it is deemed easier to construct and the disadvantage to some signal/power lines is tolerable.

Figure 9:
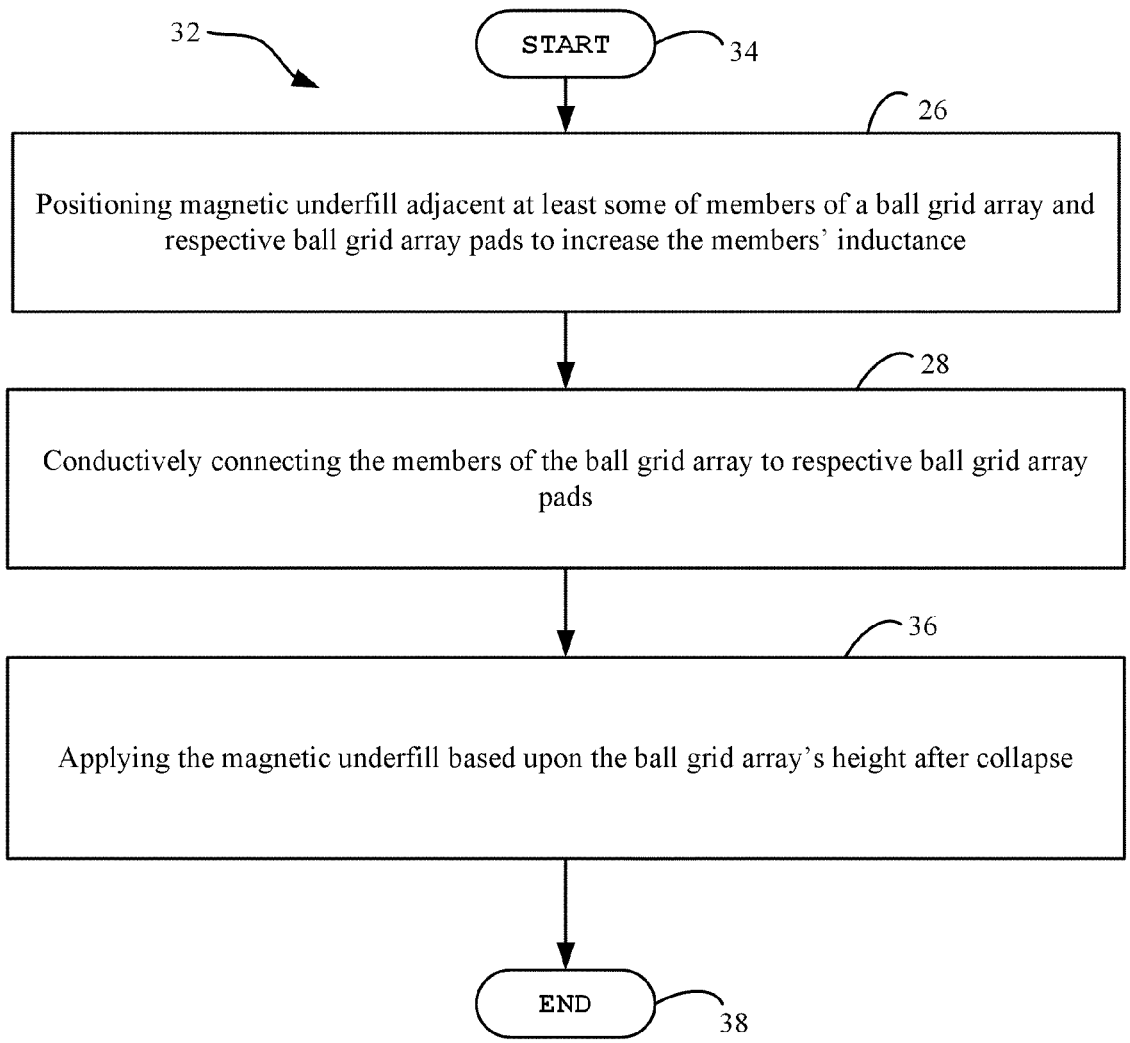
FIG. 9 is a flowchart illustrating method aspects according to the method of FIG. 8.

In another method embodiment, which is now described with reference to flowchart 32 of FIG. 9, the method begins at Block 34. The method may include the steps of FIG. 4 at Blocks 26 and 28. The method may additionally include applying the magnetic underfill based upon the ball grid array's height after collapse at Block 36. The method ends at Block 38. For instance, inductance and extra inductance is related to the height, and to achieve the best performance, these parameters need to be considered.

Figure 10:
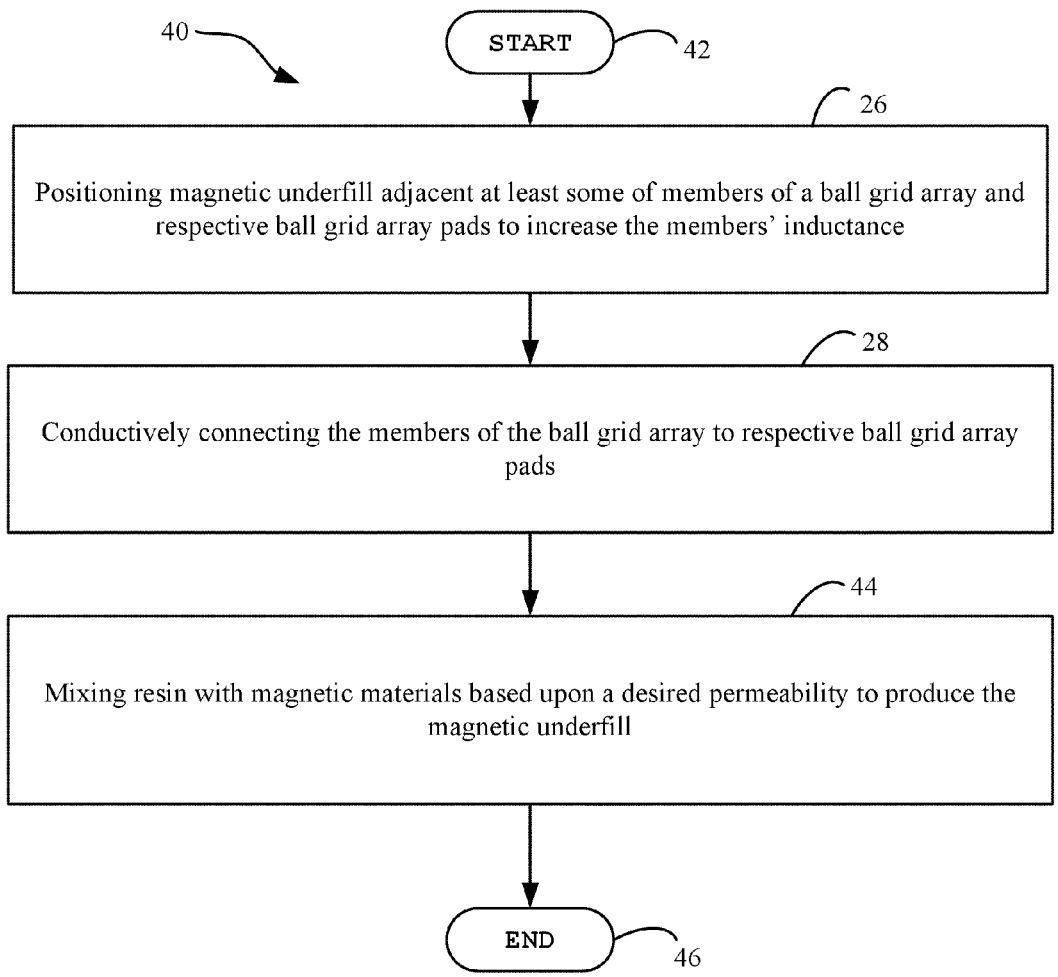
FIG. 10 is a flowchart illustrating method aspects according to the method of FIG. 8.

In another method embodiment, which is now described with reference to flowchart 40 of FIG. 10, the method begins at Block 42. The method may include the steps of FIG. 4 at Blocks 26 and 28. The method may additionally include mixing resin with magnetic materials based upon a desired permeability to produce the magnetic underfill at Block 44. The method ends at Block 46.

Figure 11:
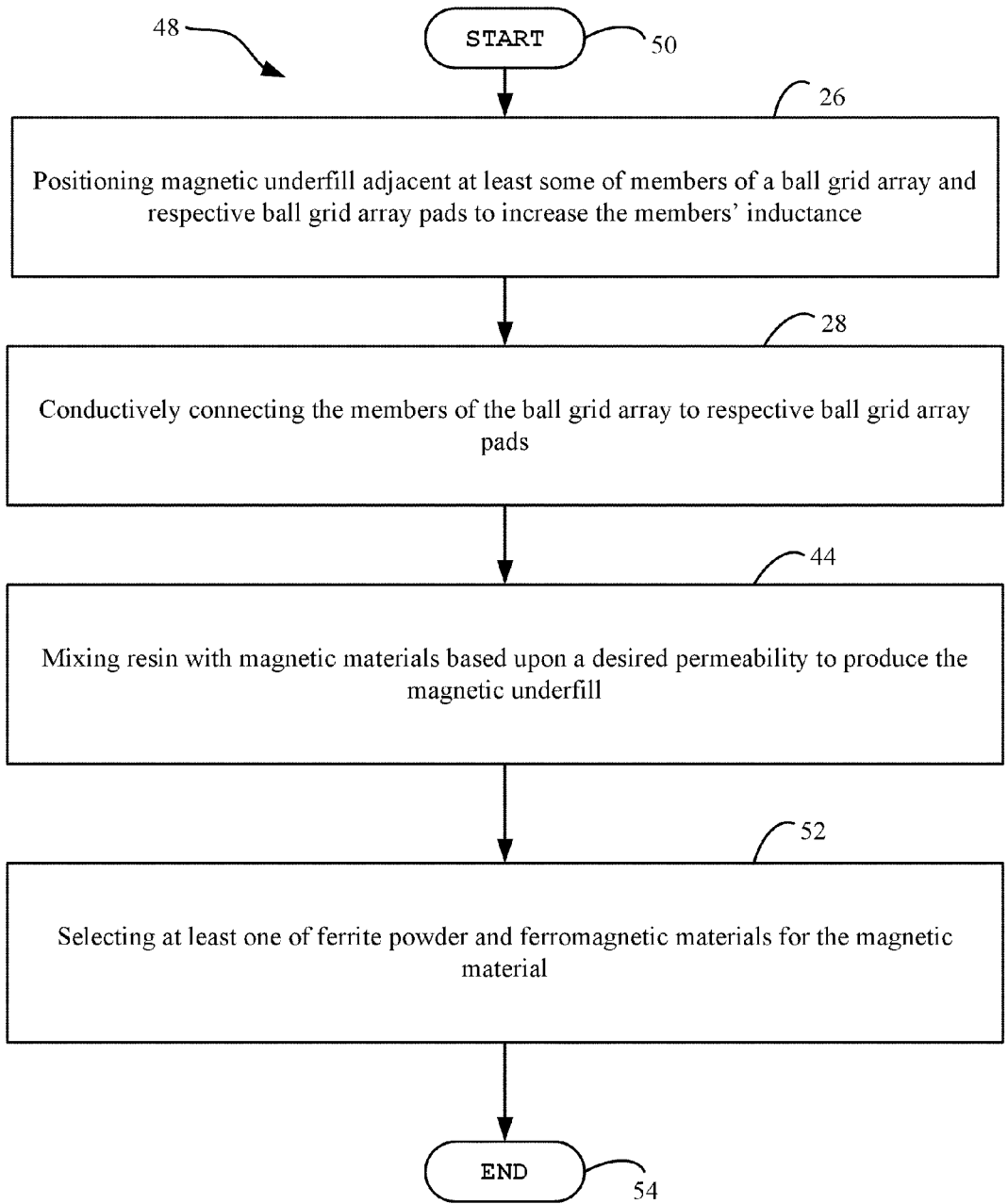
FIG. 11 is a flowchart illustrating method aspects according to the method of FIG. 6.

In another method embodiment, which is now described with reference to flowchart 48 of FIG. 11, the method begins at Block 50. The method may include the steps of FIG. 6 at Blocks 26, 28, and 44. The method may additionally include selecting at least one of ferrite powder and ferromagnetic materials for the magnetic material at Block 52. The method ends at Block 54.

Figure 12:
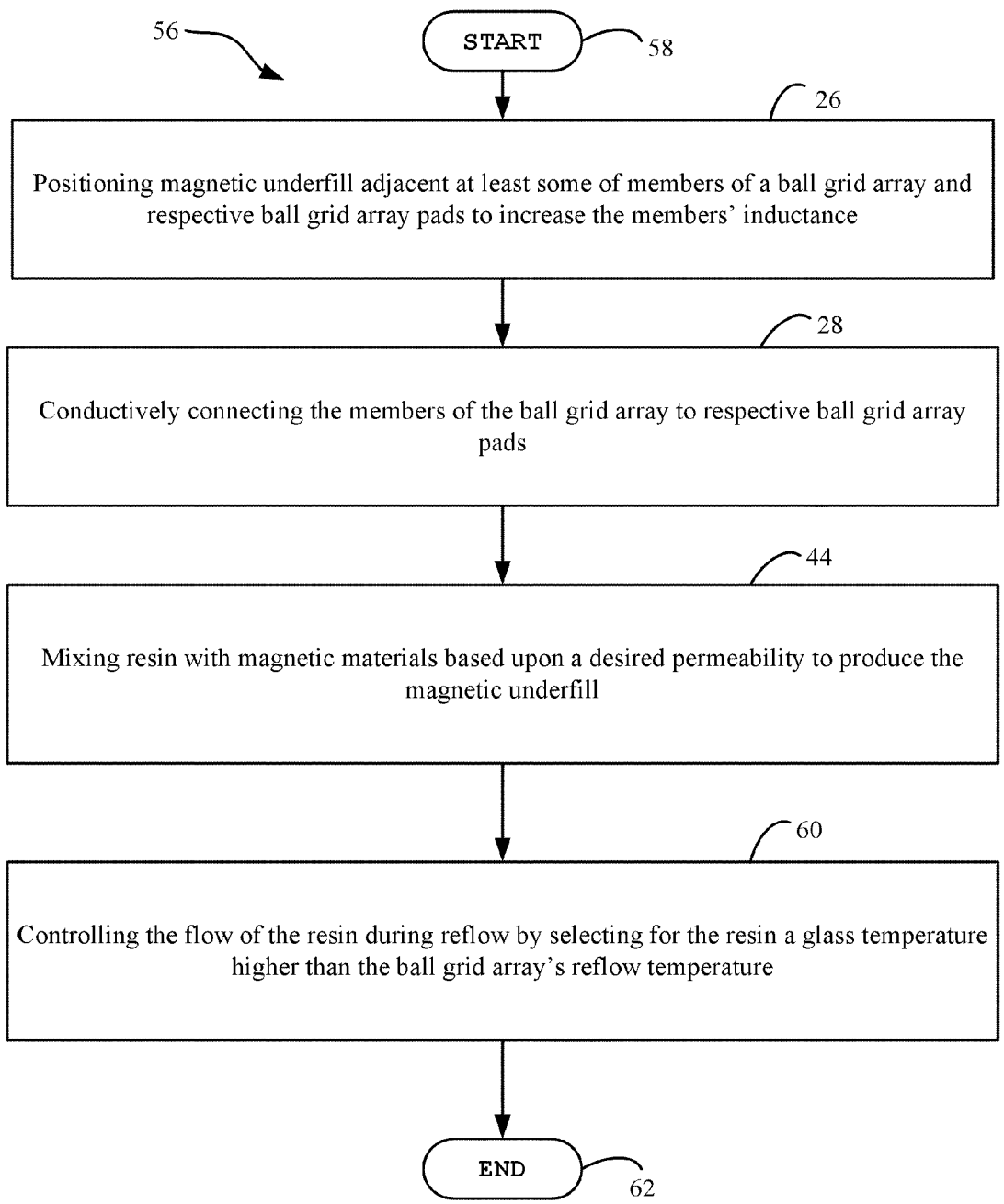
FIG. 12 is a flowchart illustrating method aspects according to the method of FIG. 10.

In another method embodiment, which is now described with reference to flowchart 56 of FIG. 12, the method begins at Block 58. The method may include the steps of FIG. 6 at Blocks 26, 28, and 44. The method may additionally include controlling the flow of the resin during reflow by selecting for the resin a glass temperature higher than the ball grid array's reflow temperature at Block 60. The method ends at Block 62.

Figure 13:
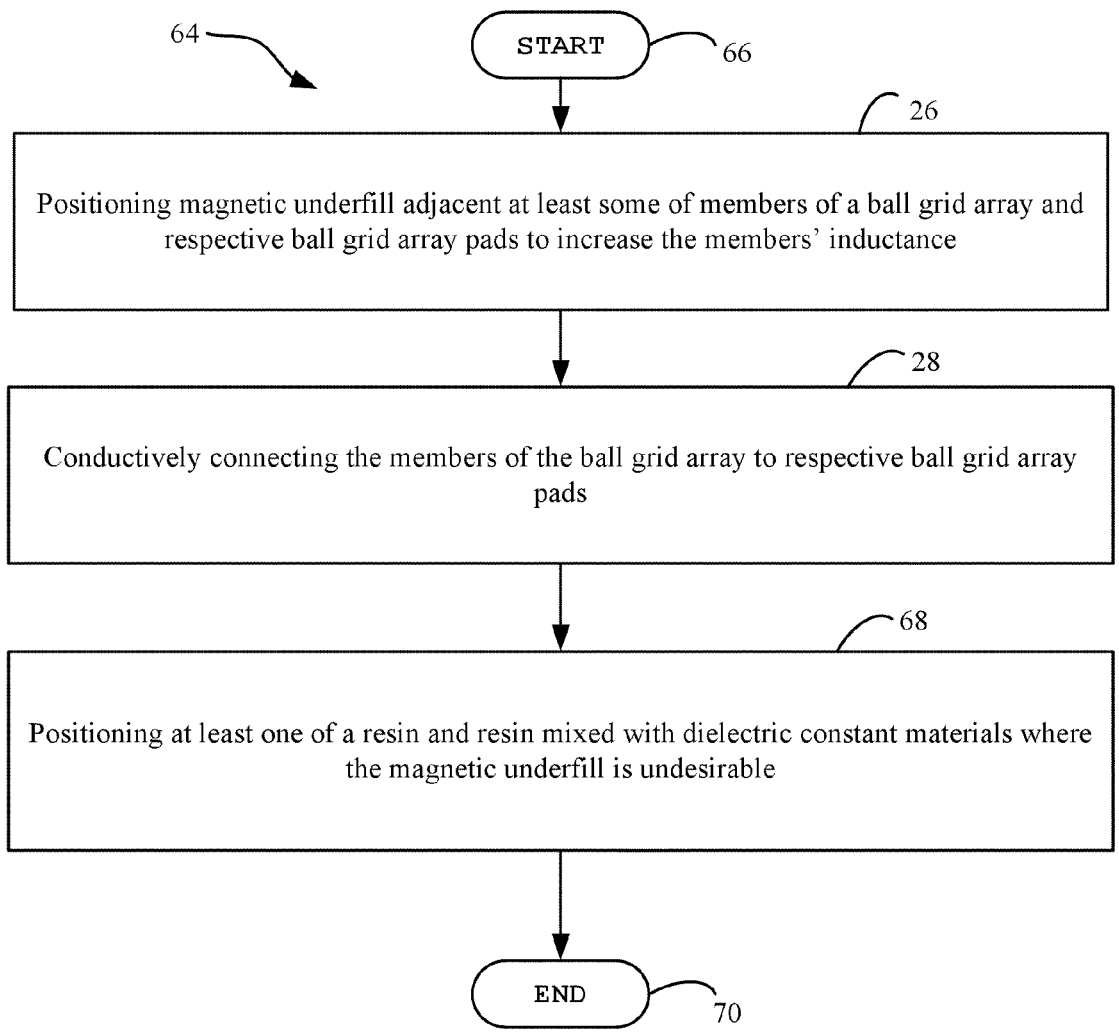
FIG. 13 is a flowchart illustrating method aspects according to the method of FIG. 10.

In another method embodiment, which is now described with reference to flowchart 64 of FIG. 13, the method begins at Block 66. The method may include the steps of FIG. 4 at Blocks 26 and 28. The method may additionally include positioning at least one of a resin and resin mixed with dielectric constant materials where the magnetic underfill is undesirable at Block 68. The method ends at Block 70.

Figure 14:
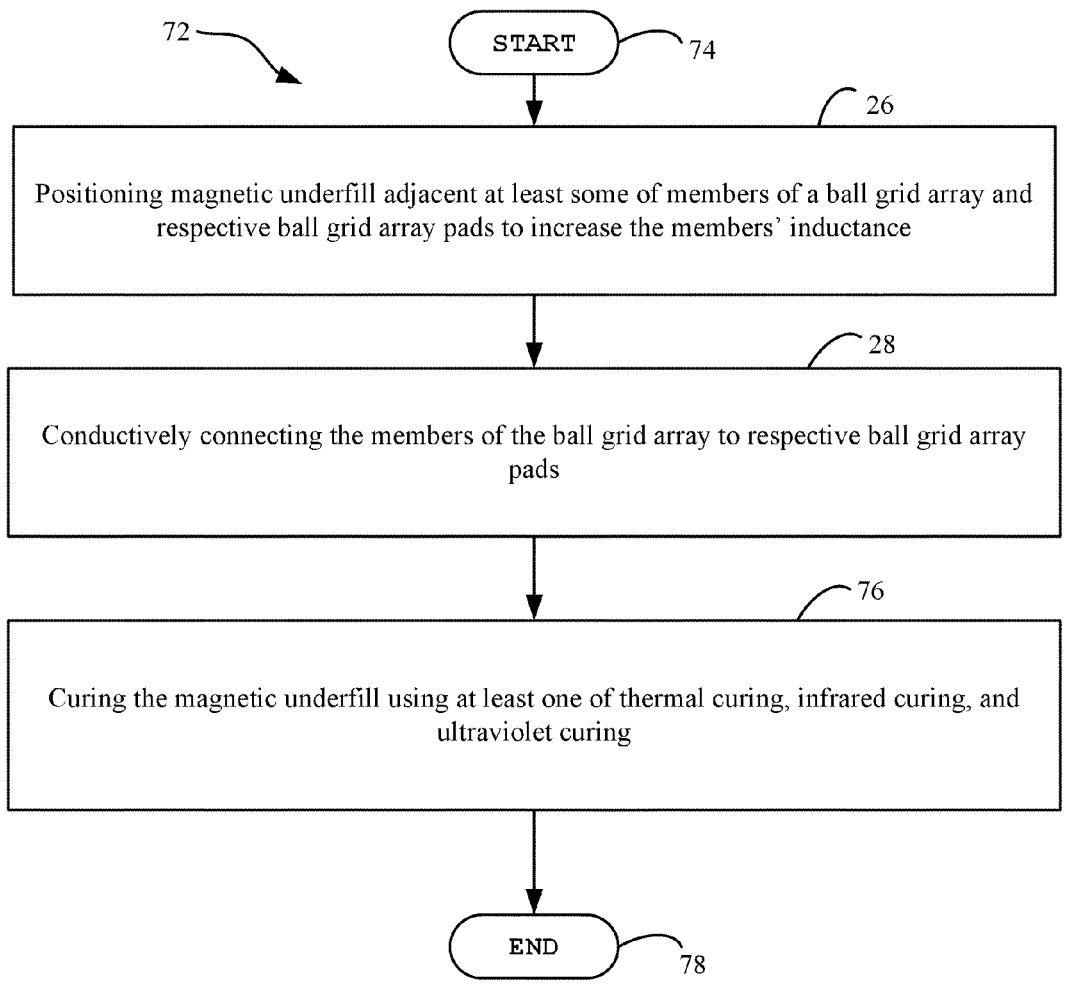
FIG. 14 is a flowchart illustrating method aspects according to the method of FIG. 10.

In another method embodiment, which is now described with reference to flowchart 72 of FIG. 14, the method begins at Block 74. The method may include the steps of FIG. 4 at Blocks 26 and 28. The method may additionally include curing the magnetic underfill using at least one of thermal curing, infrared curing, and ultraviolet curing at Block 76. The method ends at Block 78.

Figure 15:
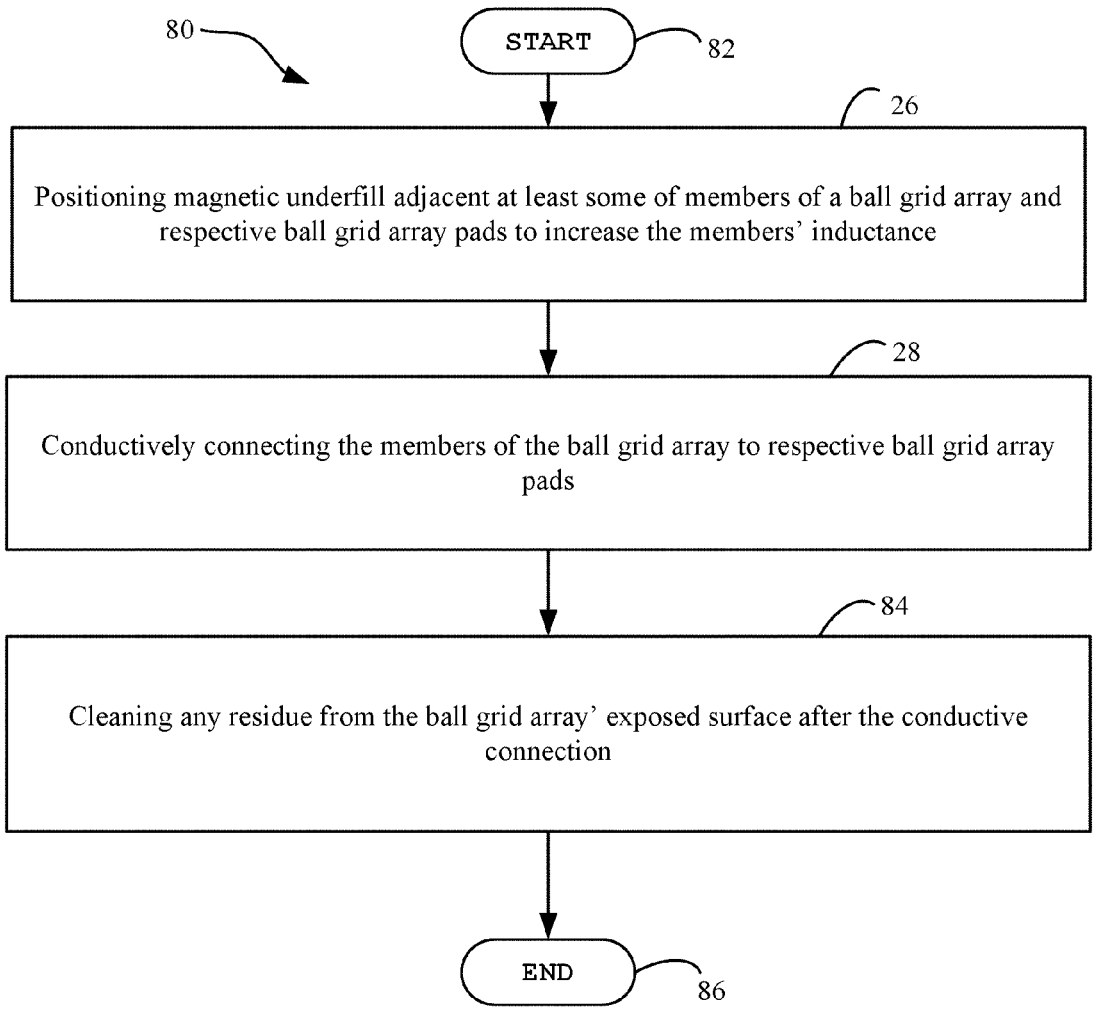
FIG. 15 is a flowchart illustrating method aspects according to the method of FIG. 10.

In another method embodiment, which is now described with reference to flowchart 80 of FIG. 15, the method begins at Block 82. The method may include the steps of FIG. 4 at Blocks 26 and 28. The method may additionally include cleaning any residue from the ball grid array' exposed surface after the conductive connection at Block 84. The method ends at Block 86.

In one embodiment, the system 10 includes ball grid array pads 12a-12n, a coreless package 20, and a ball grid array 14 carried by the coreless package. In another embodiment, the system 10 includes connection members 16a-16n of the ball grid array 14 conductively connected to respective ball grid array pads 12a-12n. In one embodiment, the system 10 includes magnetic underfill 18a-18n positioned adjacent at least some of the connection members 16a-16n and respective ball grid array pads 12a-12n to increase respective connection members' inductance, and the magnetic underfill is applied based upon the ball grid array's 14 height after collapse.

In another embodiment, the system 10 includes ball grid array pads 12a-12n, a coreless package 20, and a ball grid array 14 carried by the coreless package. In one embodiment, the system 10 includes connection members 16a-16n of the ball grid array 14 conductively connected to respective ball grid array pads 12a-12n. In another embodiment, the system 10 includes magnetic underfill 18a-18n positioned adjacent at least some of the connection members 16a-16n and respective ball grid array pads 12a-12n to increase respective connection members' inductance. In one embodiment, the system 10 includes resin and/or resin mixed with dielectric constant materials 21a"-21n" positioned where the magnetic underfill 18a-18n is undesirable.

In view of the foregoing, the system 10 improves core package connections. As a result, the system 10 improves signal integrity of high-speed signals by reducing the impedance discontinuity between the ball grid array 14 and ball grid array pads 12a-12n, for example.

For instance, extra capacitance associated with a ball grid array may introduce impedance discontinuity and cause detrimental effect on signals transmitted via such. In addition, coreless packages do not have a thick core that can be used to reduce ball grid array pads' capacitance. However, system 10 addresses these problems.

In one embodiment, ferrite powders are mixed with epoxy resin material to form a mixture with a desired permeability. In another embodiment, the permeability of the mixture depends on the ferrite material and the amount of it. For example, doped Yttrium-Iron-Garnet (YIG) materials have a range of permeabilities to choose from. In one embodiment, when light magnetic doping is needed, ferromagnetic materials are used.

In one embodiment, after a chip is packaged and ball grid arrays 14 are added, certain amounts of this mixture is applied between connection members 16a-16n of the ball grid arrays 14. In another embodiment, the amount of the mixture that is applied is determined by the ball grid array 14 height after collapse and/or the like. In one embodiment, the packaged chip with the ball grid array 14 underfill is reflowed to a system board.

In one embodiment, the magnetic underfill 18a-18n will increase the inductance of the ball grid array 14 by m times, where m is the effective permeability of the mixture material. In another embodiment, m can be easily adjusted to cover a wide range of permeabilities.

In one embodiment, the increased inductance will offset the extra capacitance from ball grid array 14 and ball grid array pads 12a-12n, and therefore it will decrease impedance discontinuity. In another embodiment, since permeability of the mixture can be changed by changing ferrite materials, or the amount of such, an optimal case can be achieved that substantially compensates for the extra capacitance.

In one embodiment, the system 10 is implementable with coreless packages. In another embodiment, if higher inductance is needed, more ferrite powders or powders with higher permeability can be used.

In one embodiment, screening epoxy resin based materials can be done with standard screening processes, and other manufacturing steps are the same as the standard procedures. In another embodiment, screen low viscosity filled material on the bottom side of the package following place and reflow of the ball grid array 14 balls.

In one embodiment, a low to mild pressure from the squeeze is acceptable since the application of the material does not have to be very even. In another embodiment, and depending on the material, a quick cure step, e.g. thermal, IR, or UV, may be employed to improve the set up of the material. In one embodiment, a plasma cleaning or wash may be employed to remove any residue from the exposed surface of the ball grid array 14 ball prior to final test and ship of the component.

In one embodiment, the system 10 would require a screen design with an opening in the center of the ball grid array 14 field where power and ground ball grid array's are typically located. In another embodiment, the system 10 would require the screening process outlined for the preceding embodiment along with a second screening process where a material without the magnetic filler, e.g. resin mixed with dielectric constant materials 21a"-21n", which would be screened in the center of the part and surround the power and ground of the ball grid array 14. The filler in the center material may include high dielectric such as Barium Titanate ("BaTi03") for improved decoupling in the power and ground distribution in the package.

In one embodiment, magnetic underfill 18a-18n is applied in the entire ball grid array 14 area. Such may be a one step screening process. In another embodiment, magnetic underfill 18a-18n is applied in certain areas, e.g., high speed signal area, but not other areas, e.g. power supplies. Such may be a one step screening process. In one embodiment, it will require the epoxy resin to have a glass temperature higher than ball grid array 14 reflow temperature, so that the mixture materials will not spread during reflow.

In one embodiment, magnetic underfill 18a-18n is applied in certain areas, e.g. high speed signal areas. In other areas, epoxy "as is" or epoxy mixed with high dielectric constant materials 21a"-21n" are applied to areas such as the power supply area. The foregoing may be a two (or multiple) step process. In another embodiment, when an epoxy mixed with a high dielectric constant materials 21a"-21n" is used, an extra benefit from increased capacitance for the power supply can be achieved. In one embodiment, there is no need to require epoxy resin to have glass temperature higher than the ball grid array 14 reflow temperature.

As will be appreciated by one skilled in the art, aspects of the invention may be embodied as a system, method or computer program product. Accordingly, aspects of the invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A system comprising:
   ball grid array pads;
   a ball grid array, the ball grid array having a plurality of connection members;
   the connection members of said ball grid array conductively connected to respective ball grid array pads; and
   magnetic underfill positioned adjacent at least some of said connection members and respective ball grid array pads to increase respective connection members' inductance;
   wherein said magnetic underfill comprises resin mixed with magnetic materials; and
   wherein said resin has a glass temperature higher than said ball grid array's reflow temperature so flow of said resin can be controlled during reflow.

2. The system of claim 1 wherein said resin comprises epoxy and said magnetic material comprises at least one of ferrite powder and ferromagnetic materials.

3. The system of claim 1 wherein the mixture is selected based upon a desired permeability.

4. The system of claim 1 wherein said magnetic underfill is applied based upon said ball grid array's height after collapse.

5. The system of claim 1 further comprising at least one of resin and resin mixed with dielectric constant materials positioned where said magnetic underfill is undesirable.

6. The system of claim 1 wherein said ball grid array is carried by a coreless package.

7. A system comprising:
   ball grid array pads;
   a coreless package;
   a ball grid array carried by said coreless packaging;
   connection members of said ball grid array conductively connected to respective ball grid array pads;
   magnetic underfill positioned adjacent at least some of said connection members and respective ball grid array pads to increase respective connection members' inductance, and said magnetic underfill applied based upon said ball grid array's height after collapse; and
   at least one of resin and resin mixed with dielectric constant materials positioned between two portions of said magnetic underfill.

8. The system of claim 7 wherein said magnetic underfill comprises resin mixed with magnetic materials.

9. The system of claim 8 wherein said resin comprises epoxy and said magnetic material comprises at least one of ferrite powder and ferromagnetic materials.

10. The system of claim 8 wherein the mixture is selected based upon a desired permeability.

11. The system of claim 8 wherein said resin has a glass temperature higher than said ball grid array's reflow temperature so flow of said resin can be controlled during reflow.

12. A system comprising:
    ball grid array pads;
    a coreless package;
    a ball grid array carried by said coreless packaging;
    connection members of said ball grid array conductively connected to respective ball grid array pads;
    magnetic underfill positioned adjacent at least some of said connection members and respective ball grid array pads to increase respective connection members' inductance; and
    at least one of resin and resin mixed with dielectric constant materials positioned between two portions of said magnetic underfill.

13. The system of claim 12 wherein said magnetic underfill comprises resin mixed with magnetic materials.

14. The system of claim 13 wherein the mixture is selected based upon a desired permeability.

15. A system comprising:
    ball grid array pads;
    a coreless package;
    a ball grid array carried by said coreless packaging;
    connection members of said ball grid array conductively connected to respective ball grid array pads; and
    magnetic underfill positioned adjacent at least some of said connection members and respective ball grid array pads to increase respective connection members' inductance, and said magnetic underfill applied based upon said ball grid array's height after collapse;
    wherein said magnetic underfill comprises resin mixed with magnetic materials; and
    wherein said resin has a glass temperature higher than said ball grid array's reflow temperature so flow of said resin can be controlled during reflow.

16. The system of claim 15 wherein said resin comprises epoxy and said magnetic material comprises at least one of ferrite powder and ferromagnetic materials.

17. The system of claim 15 wherein the mixture is selected based upon a desired permeability.

* * * * *